(12) United States Patent
Hetrich et al.

(10) Patent No.: US 11,749,428 B2
(45) Date of Patent: Sep. 5, 2023

(54) ELECTRICALLY RESISTIVE DEVICES, INCLUDING VOLTAGE DIVIDERS

(71) Applicant: ABB Schweiz AG, Baden (CH)

(72) Inventors: Matthew Hetrich, Cary, NC (US); Daniel Pierce Armstrong, Apex, NC (US); Elio Alberto Perigo, Wendell, NC (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/072,187

(22) Filed: Oct. 16, 2020

(65) Prior Publication Data
US 2022/0122750 A1 Apr. 21, 2022

(51) Int. Cl.
*H01C 10/42* (2006.01)
*H01C 10/16* (2006.01)
*H01C 17/065* (2006.01)
*G01R 15/04* (2006.01)

(52) U.S. Cl.
CPC ............ *H01C 10/42* (2013.01); *H01C 10/16* (2013.01); *H01C 17/06506* (2013.01); *G01R 15/04* (2013.01)

(58) Field of Classification Search
CPC .. H01C 10/42; H01C 10/16; H01C 17/06506; H01C 17/00; H01C 17/20; H01C 17/02; H01C 17/04; H01C 17/06; G01R 15/04
USPC .............. 338/322, 332, 266, 326, 220
See application file for complete search history.

(56) References Cited

U.S. PATENT DOCUMENTS

| | | | | |
|---|---|---|---|---|
| 1,970,051 A | * | 8/1934 | McWeeny | H01C 1/16 338/268 |
| 4,185,263 A | * | 1/1980 | Frey | H01C 3/18 338/160 |
| 4,485,387 A | * | 11/1984 | Drumheller | B05C 5/0295 118/401 |
| 2014/0176294 A1 | * | 6/2014 | Smith | H01C 17/28 338/322 |

* cited by examiner

*Primary Examiner* — Edwin A. Leon
*Assistant Examiner* — Iman Malakooti
(74) *Attorney, Agent, or Firm* — Armstrong Teasdale LLP

(57) ABSTRACT

Electrically resistive devices, such as voltage dividers, and methods of making the same are disclosed. An illustrative voltage divider may include a substrate having an axis, an electrically resistive path applied to the substrate, and at least one terminal positioned around the substrate and in contact with the electrically resistive path. The electrically resistive path may include a primary resistor and a secondary resistor, with the primary resistor having a higher electrical resistance than the secondary resistor. An adjustable displacement of the at least one terminal along the axis of the substrate may allow adjustment of at least one electrical resistance associated with the at least one terminal. An adjustable tightness of the at least one terminal around the substrate may allow adjustment of the at least one electrical resistance associated with the at least one terminal.

20 Claims, 4 Drawing Sheets

ELECTRICALLY RESISTIVE DEVICES, INCLUDING VOLTAGE DIVIDERS

TECHNICAL FIELD

The present disclosure relates to electrically resistive devices and, in particular, voltage dividers using high voltage thick film resistors.

BACKGROUND

A high voltage divider may include two thick film resistors connected in series. The voltage divider can be used to step down higher voltages, often to logic levels that can be read by a computer or controller. These resistors typically have high overall resistances (Mega-ohms to Giga-ohms) as to not draw significant current from the source, as well as a precisely controlled ratio between resistors for accurate output voltages. When producing thick film voltage dividers, it is typically not possible to take in situ resistance measurements. Without additional steps, this creates an open loop without any feedback or capability to fine-tune resistance values.

Traditionally, the manufacturing process includes screen printing a design on a ceramic substrate, firing the substrate at greater than 600 degrees Celsius, and then laser ablating to precisely remove material from the resistors. The ratio between the resistors and the overall resistance is then fine-tuned using the laser ablation. The laser system adds significant cost, maintenance, complexity, and time to the manufacturing process. When precision is less of a factor, parts of the resistor can be mechanically ablated off. This method can be cheaper and simpler than laser ablation but results in low accuracy resistances.

SUMMARY

The present disclosure includes one or more of the features recited in the appended claims and/or the following features which, alone or in any combination, may comprise patentable subject matter.

According to one aspect, a voltage divider may comprise a substrate having an axis, an electrically resistive path applied to the substrate, and at least one terminal positioned around the substrate and in contact with the electrically resistive path. The electrically resistive path may include a primary resistor and a secondary resistor, with the primary resistor having a higher electrical resistance than the secondary resistor. An adjustable displacement of the at least one terminal along the axis of the substrate may allow adjustment of at least one electrical resistance associated with the at least one terminal.

In some embodiments, an adjustable tightness of the at least one terminal around the substrate may allow adjustment of the at least one electrical resistance associated with the at least one terminal.

In some embodiments, an adjustable amount of contact area between the at least one terminal and the substrate may also allow adjustment of the at least one electrical resistance associated with the at least one terminal.

In some embodiments, the primary resistor may have a higher aspect ratio than the secondary resistor.

In some embodiments, the electrically resistive path may be applied to the substrate using an additive manufacturing process.

In some embodiments, the primary resistor may include a paste that is applied in a serpentine path along the substrate.

In some embodiments, the secondary resistor may include a paste that is applied over an entire surface of the substrate.

In some embodiments, the at least one terminal may include first and second terminals. Adjustment of a distance between the first and second terminals along the axis of the substrate may adjust an electrical resistance between the first and second terminals.

In some embodiments, the at least one terminal may comprise first, second, and third terminals.

In some embodiments, the first terminal may be positioned on the primary resistor, the second terminal may be positioned on the secondary resistor, and the third terminal may be positioned between the first and second terminals.

According to another aspect, a method of making an electrically resistive device may comprise applying an electrically resistive path to a substrate, positioning at least one terminal around the substrate and in contact with the electrically resistive path, and adjusting a displacement of the at least one terminal along the substrate to adjust at least one electrical resistance associated with the at least one terminal.

In some embodiments, the method may further comprise adjusting a contact surface area between the at least one terminal and the substrate to adjust the at least one electrical resistance associated with the at least one terminal.

In some embodiments, adjusting the contact surface area between the at least one terminal and the substrate may comprise adjusting a tightness of the at least one terminal around the substrate.

In some embodiments, applying the electrically resistive path to the substrate may be performed using additive manufacturing.

In some embodiments, the electrically resistive device may be a voltage divider, and the electrically resistive path includes a primary resistor and a secondary resistor. The primary resistor may have a higher electrical resistance than the secondary resistor.

In some embodiments, applying the electrically resistive path to the substrate comprises applying a paste in a serpentine path along the substrate to form the primary resistor.

In some embodiments, applying the electrically resistive path to the substrate may comprise applying a paste over an entire surface of the substrate to form the secondary resistor.

In some embodiments, the at least one terminal may comprise first, second, and third terminals. Positioning at least one terminal around the substrate and in contact with the electrically resistive path may comprise positioning (i) the first terminal on the primary resistor and (ii) the second terminal on the secondary resistor.

In some embodiments, the at least one terminal may include first and second terminals. Adjusting the displacement of the at least one terminal along the substrate may comprise adjusting a distance between the first and second terminals along the substrate to adjust an electrical resistance between the first and second terminals.

According to yet another aspect, an electrically resistive device may comprise a cylindrical dielectric substrate having an axis, an electrically resistive path applied to the substrate, and a terminal positioned around the substrate and in contact with the electrically resistive path. An adjustable displacement of the terminal along the axis of the substrate may allow adjustment of an electrical resistance associated with the terminal. An adjustable tightness of the terminal around the substrate may also allows adjustment of the electrical resistance associated with the terminal.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

Figure 1:
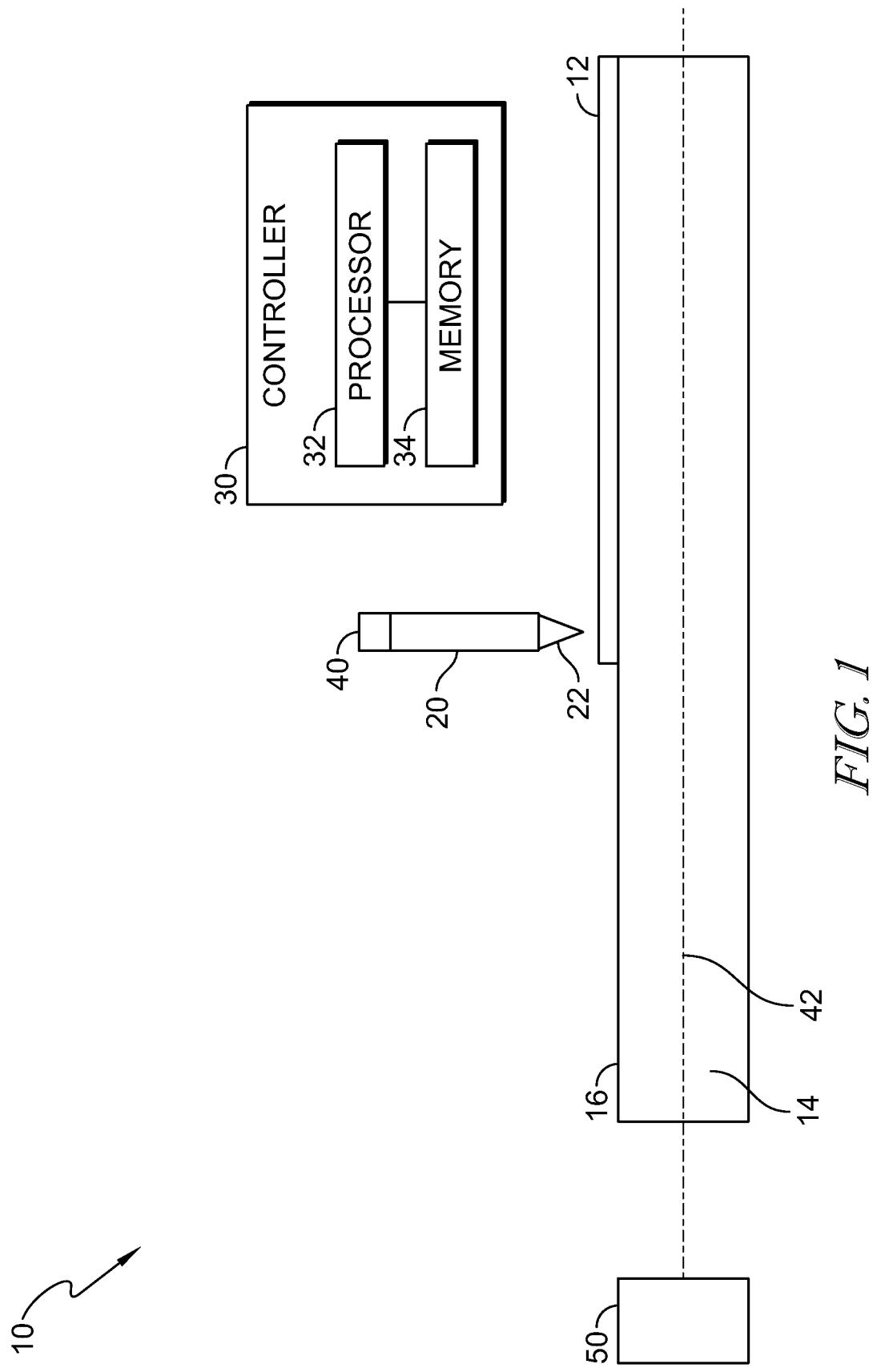
FIG. 1 is a schematic of a system for applying a conductive paste to a dielectric material using additive manufacturing.

While the concepts of the present disclosure are susceptible to various modifications and alternative forms, specific embodiments thereof have been shown by way of example in the figures and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

The disclosed embodiments include methods of placing terminals on a high voltage integrated voltage divider, or resistor, as well as the appropriate resistive design to maximize the precision and provide the capability to reach extreme voltage divider ratios with a single resistive paste.

Referring to FIG. 1, an additive manufacturing system 10 is configured to apply a conductive paste 12 onto a substrate 14 to form a voltage divider. As used herein, the term "conductive" refers to materials that are conductive or semi-conductive, for example, more conductive than the substrate 14. The substrate 14 is formed from a dielectric material, e.g. ceramic, plastic, or the like. The substrate 14 includes an outer surface 16 to which the conductive paste 12 is applied. As described in more detail below, the conductive paste 12 is applied in patterns on the substrate 14 to form resistors on the substrate 14. While the present disclosure illustratively refers to an additive manufacturing process, it will be appreciated that other processes could be used to apply the conductive paste 12 onto the substrate 14, such as fused deposition modeling, extrusion, screen printing, and the like.

The conductive paste 12 is applied to the substrate 14 with a dispensing needle 20 having a tip 22. The conductive paste 12 is ejected from the tip 22 onto the substrate 14. A controller 30 controls the application of the conductive paste 12 onto the substrate 14. The controller 30 includes a processor 32 and a memory 34. The memory 34 includes instructions that, when executed by the processor 32, cause the needle 20 to apply the conductive paste 12 into the substrate 14.

A linear motor 40 is operated by the controller 30 to move the needle 20 along a longitudinal axis 42 of the substrate 14. That is, the motor 40 moves the needle 20 from a first end 44 of the substrate 14 to a second end 46 of the substrate 14. A rotational motor 50 is also operated by the controller 30. The rotational motor 50 is coupled to the substrate 14 and causes the substrate 14 to rotate about the longitudinal axis 42. Accordingly, by operating both motors 40 and 50, the conductive paste 12 is applied around the outer (circumferential) surface of the substrate 14.

Figure 2:
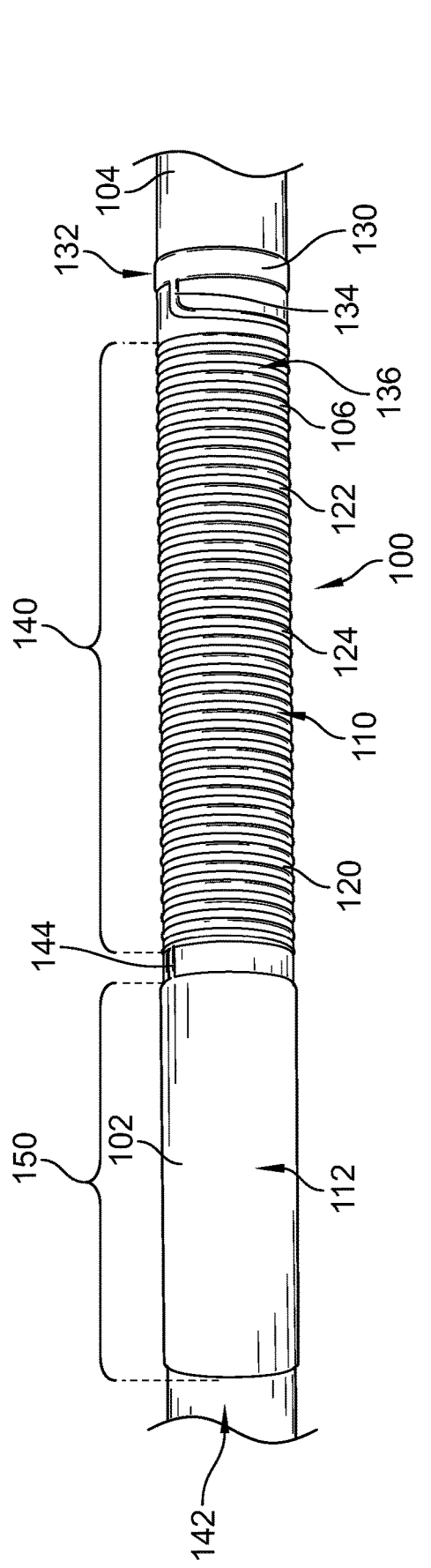
FIG. 2 is a side elevation view of a voltage divider in accordance with one embodiment, without terminals applied.

FIG. 2 illustrates a voltage divider 100 having a conductive paste 102 applied to a substrate 104 in a pattern to form an electrically resistive path (hereinafter, "resistive path") 106 having a primary resistor 110 and a secondary resistor 112. The primary resistor 110 includes a pattern of conductive paste 102 that forms a serpentine path 120 having paste portions 122 separated by spaces 124 that do not include conductive paste 102. That is, the serpentine path 120 traverses back-and-forth around an outer surface of the substrate 104 in a primary resistor region 140. An end resistor pad 130 encircles the circumference of the substrate 104 at an end 132 of the primary resistor region 140. A leg 134 of the serpentine path 120 extends from the end resistor pad 130 to a portion 136 of the serpentine path 120. While the primary resistor 110 is illustratively embodied as a serpentine path 120 in the drawings, it is contemplated that other continuous non-overlapping paths (e.g., a helical path) of conductive paste 102 could be used to form the primary resistor 110.

The secondary resistor 112 is formed in a secondary resistor region 150 that extends from an end 142 of the substrate 104 toward the primary resistor 110. The conductive paste 102 covers an entire outer surface of the substrate 104 in the secondary resistor region 150. In other embodiments, the conductive paste 102 may cover most (but less than all) of the outer surface of the substrate 104 in the secondary resistor region 150. For instance, in some embodiments, the conductive paste 102 may cover at least 50%, at least 80%, or at least 90% of the outer surface of the substrate 104 in the secondary resistor region 150. The secondary resistor 112 is coupled to the primary resistor 110 by a path 144 of conductive paste 102 extending between the primary resistor region 140 and the secondary resistor region 150.

In the illustrative embodiment, the entire resistive path 106 is applied continuously using the additive manufacturing printing method described above and a single conductive paste formulation. The secondary resistor 112 of the resistive path 106 corresponds to a secondary resistor of the voltage divider 100 and covers the entire outer surface to provide a lower aspect ratio (resulting in a lower electrical resistance). The primary resistor 110 of the resistive path 106 corresponds to a primary resistor of the voltage divider 100 and has a higher aspect ratio (resulting in a higher electrical resistance) than the secondary resistor 112 of the voltage divider 100. In other embodiments, different electrical resistances between the primary and secondary resistors 110, 112 can be achieved in other ways (alternatively or additionally to varying aspect ratio). For instance, different pastes grades can be used to vary the sheet resistivity of the primary and secondary resistors 110, 112 (e.g., one paste could be used to form the primary resistor 110 while another past of differing conductivity was used to form the secondary resistor 112).

Figure 3:
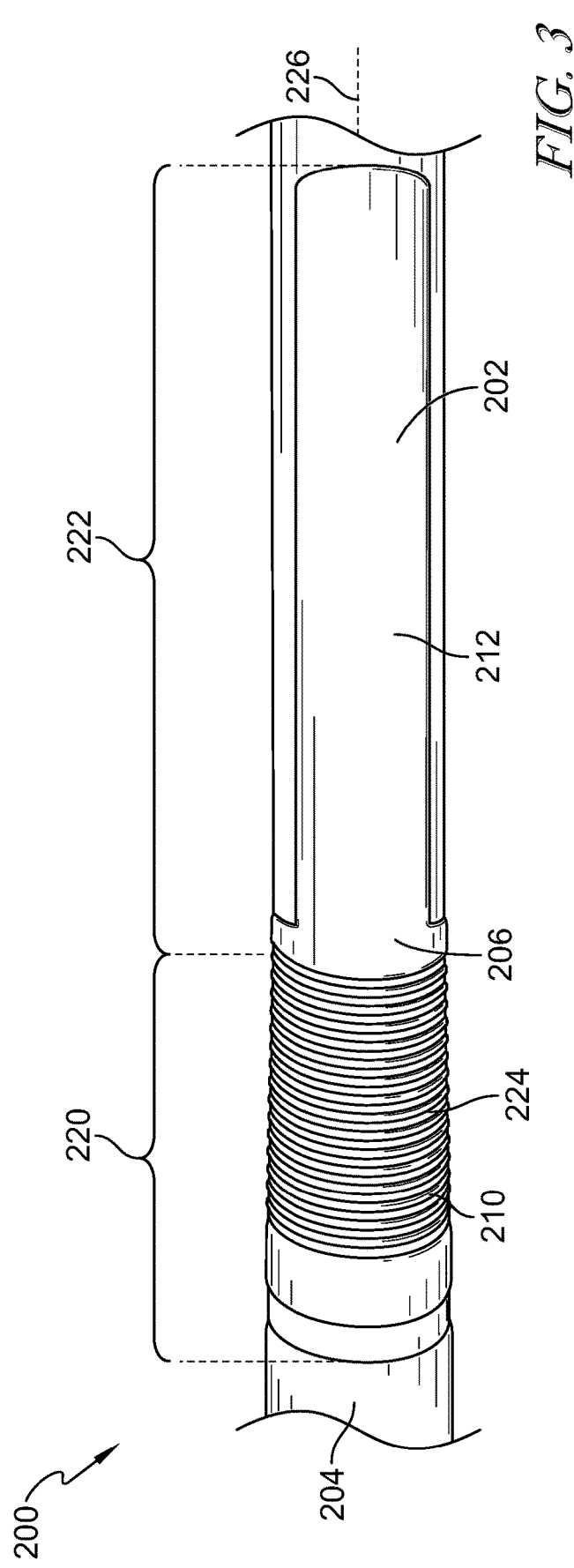
FIG. 3 is a side elevation view of another voltage divider in accordance with another embodiment, without terminals applied.

FIG. 3 illustrates another voltage divider 200 having a conductive paste 202 applied to a substrate 204 in a pattern to form resistive path 206 having a primary resistor 210 in a primary resistor region 220 and a secondary resistor 212 in a secondary resistor region 222. The primary resistor 210 includes a pattern of conductive paste 202 that is applied in a serpentine path 224, similar to the serpentine path 120 described above, to create a higher electrical resistance (e.g., higher than the electrical resistance of the secondary resistor 212). The serpentine path 224 of the primary resistor 210 extends along a longitudinal axis 226 of the substrate 204 and does not cover the entire outer surface of the substrate 204 in the primary resistor region 220. The secondary resistor 212 has a lower electrical resistance than the primary resistor 210. In the illustrative embodiment of FIG. 3, the secondary resistor 212 does not cover the entire outer surface of the substrate 204 in the secondary resistor region 222, but is continuous in the direction parallel to axis 226 over a portion of the circumference of the substrate 204 in the secondary resistor region 222.

Figure 4:
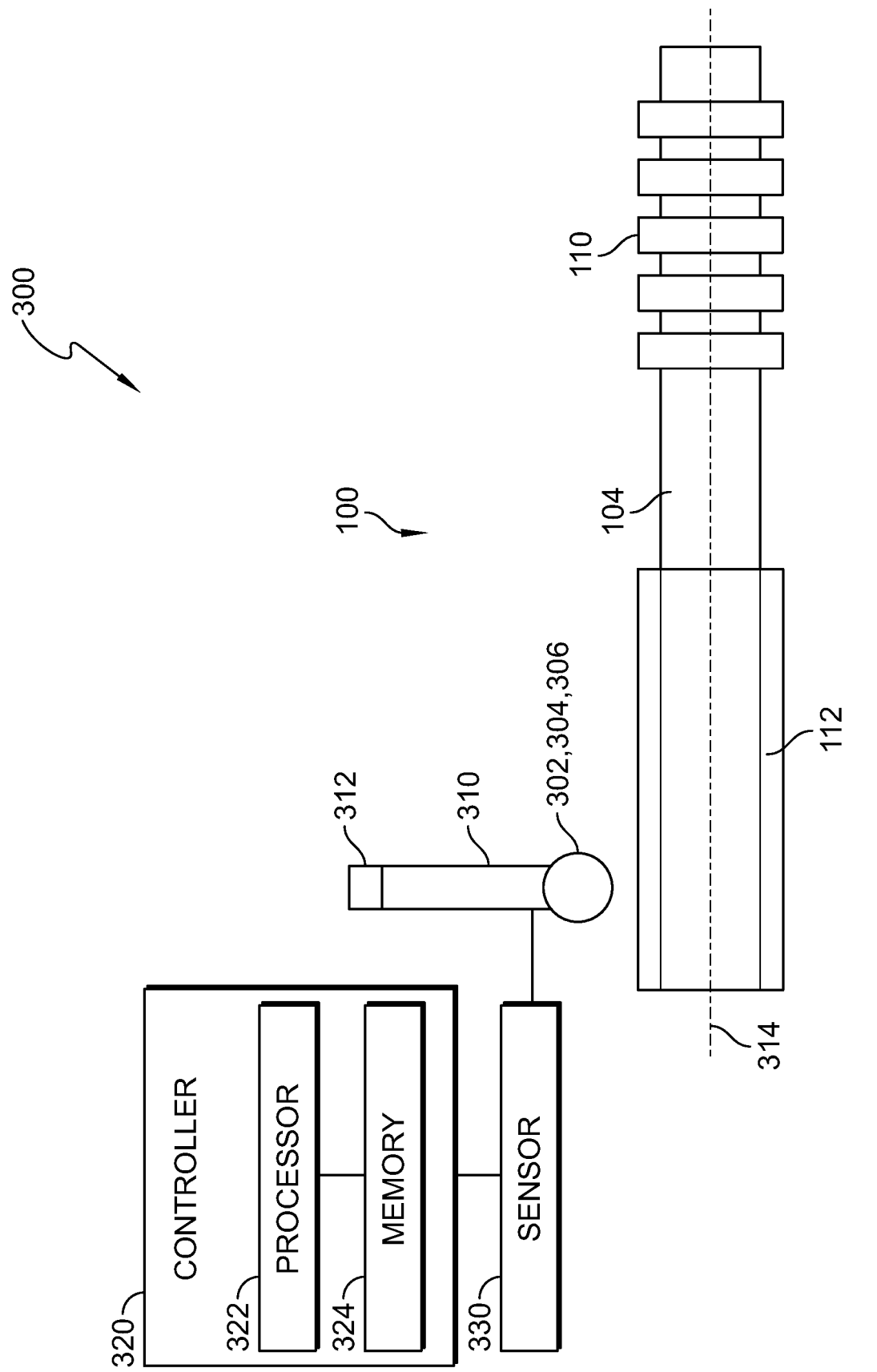
FIG. 4 is a schematic view of a system for applying terminals to a voltage divider to fine tune an electrical resistance of the voltage divider.
Figure 5:
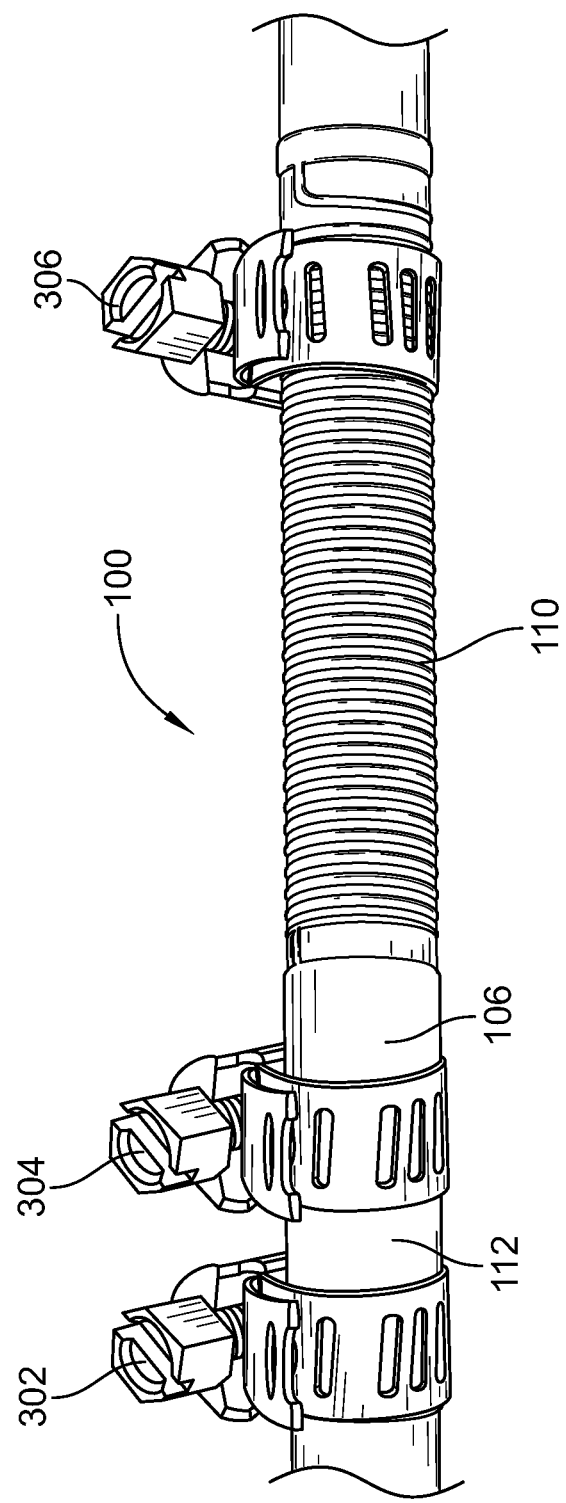
FIG. 5 is a side elevation view of the voltage divider of FIG. 2 with terminals applied.

Referring to FIG. 4, a system 300 for applying terminals to a voltage divider is discussed with relation to the voltage divider 100, wherein the voltage divider 100 includes the primary resistor 110 and the secondary resistor 112. FIG. 5 illustrates three terminals 302, 304, and 306 applied to the voltage divider 100. In some embodiments, any number of terminals may be applied to the voltage divider 100. As seen in FIG. 5, the terminals 302 and 304 are applied to the secondary resistor 112, and the terminal 306 is applied to the primary resistor 110.

Referring back to FIG. 4, the system 300 includes a placement arm 310 that retains the terminal 302, 304, or 306. A motor 312 moves the placement arm 310 along a longitudinal axis 314 of the voltage divider 100. A controller 320 is configured to operate the placement arm 310 and the motor 312. The controller 320 include a processor 322 and a memory 324. The memory 324 includes instructions that, when executed by the processor 322, cause the controller 320 to operate the placement arm 310 and the motor 312. For example, the controller 320 causes the motor 312 to move the placement arm 310 along the longitudinal axis 314 of the voltage divider 100. The controller 320 also causes the placement arm 310 to position the terminal 302, 304, or 306 on the voltage divider 100. As seen in FIG. 5, the terminals 302, 304, 306 are configured as clamps that tighten onto the voltage divider 100. Accordingly, the controller 320 also causes the placement arm 310 to tighten the terminals 302, 304, 306 onto the voltage divider 100.

A sensor 330 is configured to detect electrical resistances associated with the voltage divider 100 as the terminals 302, 304, 306 are positioned on the voltage divider 100. The sensor 330 sends signals to the controller 320 indicative of the electrical resistances so that the controller 320 can adjust the position and/or tightness of each of the terminals 302, 304, 306, as described below.

A tuning process carried out by the system 300 may include two phases. First, an axial position for each terminal 302, 304, 306 is determined and the terminal 302, 304, 306 is installed using a linear movement stage. Based off the ratio and resistances measured, the axial position of each terminal 302, 304, 306 is iteratively removed and replaced on the resistive path until the ratio is within an acceptable tolerance. That is, the terminals 302, 304, 306 are linearly adjusted along the longitudinal axis 314 of the voltage divider 100 to adjust the electrical resistances associated with the voltage divider 100. For instance, the position or displacement of the terminal 302 and/or the terminal 304 may be moved along the axis of the substrate to adjust the electrical resistance between the terminals 302, 304. In some embodiments, a decrease in the distance between the first and second terminals along the axis of the substrate decreases the electrical resistance between the first and second terminals. Similarly, the position or displacement of the terminal 304 and/or the terminal 306 may be moved along the axis of the substrate to adjust the electrical resistance between the terminals 304, 306. Because the secondary resistor 112 has a lower electrical resistance than the primary resistor 110, movement of the terminal 302 (and/or the terminal 304) causes smaller changes in the resistance between the terminals 302, 304, while similar movement of the terminal 306 (and/or the terminal 304) causes larger changes in the resistance between the terminals 304, 306. Tuning of the voltage divider 100 may involve adjustment of the positioning of one, two, or three of the terminals 302, 304, 306.

After positioning the terminals, a second tuning phase may involve adjusting the contact area between one or more of the terminals 302, 304, and 306 and the resistive path 106 of the voltage divider 100. For instance, in the illustrative embodiment, the second tuning phase involves adjusting the tightness of one or more of the terminals 302, 304, and 306 to modify the contact area between the resistive path 106 and the terminals 302, 304, 306. This adjustable amount of contact area varies the contact resistance between the resistive path 106 and terminals 302, 304, 306 to adjust one or more of the resistances measured from the voltage divider 100, e.g., by sensor 330. For example, any one of the terminals 302, 304, 306 may be tightened to decrease the resistance(s) associated with that terminal or loosened to increase the resistance(s) associated with that terminal. Tuning of the voltage divider 100 may involve adjustment of the tightness of one, two, or three of the terminals 302, 304, 306. The terminal design allows for a precise placement of the electrical contact and a controlled shape of the contactor.

In other embodiments, the contact area between one or more of the terminals 302, 304, and 306 and the resistive path 106 may be adjusted by changing a dimension (e.g., a width) of the terminal. For example, one or more of the terminals 302, 304, 306 may have an adjustable width for contacting the resistive path 106. As another example, terminals of varying widths may be available for use in the voltage divider 100, and adjusting the contact area between one or more of the terminals 302, 304, and 306 and the resistive path 106 may involve removing one terminal and replacing it with a different terminal having a different width.

The disclosed embodiments provide precise control of resistances and the voltage divider ratio. The disclosed embodiments also leverage the already requisite process of installing terminals, while making ablation unnecessary. The disclosed embodiments can increase or decrease resistance as necessary, whereas ablation can only increase resistance. The disclosed embodiments reduce costs, complexity, and time to manufacture. Additionally, the disclosed embodiments can achieve extreme voltage divider ratios while using one continuous paste.

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the methods, systems, and articles described herein. It will be noted that alternative embodiments of the methods, systems, and articles of the present disclosure may not include all of the features described yet still benefit from at least some of the advantages of such features. Those of ordinary skill in the art may readily devise their own implementations of the methods, systems, and articles that incorporate one or more of the features of the present disclosure.

The invention claimed is:

1. A voltage divider comprising:
a substrate having an axis;
at least one electrically conductive paste applied to a circumferential surface of the substrate, wherein the at least one electrically conductive paste comprises a primary resistor and a secondary resistor, and wherein the primary resistor has a higher electrical resistance than the secondary resistor; and
at least one terminal positioned around the circumferential surface of the substrate and in contact with the at least one electrically conductive paste, wherein an adjustable displacement of the at least one terminal along the axis of the substrate allows adjustment of at least one electrical resistance associated with the at least one terminal.

2. The voltage divider of claim 1, wherein an adjustable tightness of the at least one terminal around the substrate also allows adjustment of the at least one electrical resistance associated with the at least one terminal.

3. The voltage divider of claim 1, wherein an adjustable amount of contact area between the at least one terminal and the at least one electrically conductive paste also allows adjustment of the at least one electrical resistance associated with the at least one terminal.

4. The voltage divider of claim 1, wherein the primary resistor has a higher aspect ratio than the secondary resistor.

5. The voltage divider of claim 1, wherein the at least one electrically conductive paste forming the primary resistor extends in a serpentine path along the circumferential surface of the substrate.

6. The voltage divider of claim 1, wherein the at least one electrically conductive paste forming the secondary resistor extends over an entire surface of a region of the substrate.

7. The voltage divider of claim 1, wherein the at least one terminal includes first and second terminals, and wherein adjustment of a distance between the first and second terminals along the axis of the substrate adjusts an electrical resistance between the first and second terminals.

8. The voltage divider of claim 1, wherein the at least one terminal comprises first, second, and third terminals.

9. The voltage divider of claim 8, wherein the first terminal is positioned on the primary resistor, and wherein the second terminal is positioned on the secondary resistor, and wherein the third terminal is positioned between the first and second terminals.

10. A method of fabricating a voltage divider, the method comprising:
applying, using an additive manufacturing process, at least one electrically conductive paste to a circumferential surface of a substrate having an axis, wherein the at least one electrically conductive paste includes a primary resistor and a secondary resistor, and wherein the primary resistor has a higher electrical resistance than the secondary resistor;
positioning at least one terminal around the circumferential surface of the substrate and in contact with the at least one electrically conductive paste; and
adjusting a displacement of the at least one terminal along the axis of the substrate to adjust at least one electrical resistance associated with the at least one terminal.

11. The method of claim 10, further comprising adjusting a contact surface area between the at least one terminal and the substrate to adjust the at least one electrical resistance associated with the at least one terminal.

12. The method of claim 11, wherein adjusting the contact surface area between the at least one terminal and the substrate comprises adjusting a tightness of the at least one terminal around the substrate.

13. The method of claim 10, wherein applying the at least one electrically conductive paste to the substrate comprises applying the at least one electrically conductive paste in a serpentine path along the substrate to form the primary resistor.

14. The method of claim 10, wherein applying the at least one electrically conductive paste to the substrate comprises applying the at least one electrically conductive paste over an entire surface of a region of the substrate to form the secondary resistor.

15. The method of claim 10, wherein the at least one terminal comprises first, second, and third terminals, and wherein positioning the at least one terminal around the substrate and in contact with the at least one electrically conductive paste comprises positioning (i) the first terminal on the primary resistor and (ii) the second terminal on the secondary resistor.

16. The method of claim 10, wherein the at least one terminal includes first and second terminals, and wherein adjusting the displacement of the at least one terminal along the substrate comprising adjusting a distance between the first and second terminals along the substrate to adjust an electrical resistance between the first and second terminals.

17. An electrically resistive device comprising:
a cylindrical dielectric substrate having an axis;
at least one electrically conductive paste applied to the cylindrical dielectric substrate; and
a terminal positioned around the cylindrical dielectric substrate and in contact with the at least one electrically conductive paste, wherein an adjustable displacement of the terminal along the axis of the cylindrical dielectric substrate allows adjustment of an electrical resistance associated with the terminal, and wherein an adjustable tightness of the terminal around the cylindrical dielectric substrate also allows adjustment of the electrical resistance associated with the terminal.

18. The electrically resistive device of claim 17, wherein the at least one electrically conductive paste extends in a serpentine path along a circumferential surface of the cylindrical dielectric substrate.

19. The electrically resistive device of claim 17, wherein the at least one electrically conductive paste extends over an entire surface of a region of the cylindrical dielectric substrate.

20. The electrically resistive device of claim 17, wherein:
the terminal comprises a first terminal,
the electrically resistive device further comprises a second terminal, and
an adjustment of a distance between the first terminal and the second terminal along the axis of the cylindrical dielectric substrate adjusts an electrical resistance between the first terminal and the second terminal.

\* \* \* \* \*